United States Patent [19]
Jones et al.
[11] 3,920,471
[45] Nov. 18, 1975

[54] PREVENTION OF ALUMINUM ETCHING DURING SILOX PHOTOSHAPING

[75] Inventors: Robert K. Jones, Lake Villa; Murad A. Meneshian, Glenview, both of Ill.
[73] Assignee: Teletype Corporation, Skokie, Ill.

[22] Filed: Oct. 10, 1974
[21] Appl. No.: 513,908

[52] U.S. Cl. .................... 134/3; 134/27; 134/28; 156/8; 156/17; 252/79.3
[51] Int. Cl.[2] .................... H01L 21/302
[58] Field of Search .................... 156/8, 17, 23; 252/79.3, 252/79.5, 387; 134/3, 27, 28

[56] References Cited
UNITED STATES PATENTS

| | | | |
|---|---|---|---|
| 3,650,960 | 3/1972 | Strauss | 156/17 |
| 3,671,437 | 6/1972 | Pless | 156/17 |
| 3,841,905 | 10/1974 | Dixon | 252/79.3 |
| 3,867,218 | 2/1975 | Henry | 156/17 |

*Primary Examiner*—Charles E. Van Horn
*Assistant Examiner*—Jerome W. Massie
*Attorney, Agent, or Firm*—J. D. Kaufmann; J. L. Landis

[57] ABSTRACT

A process of treating an article which has an upper HF-etchable layer on top of a metal layer. The metal is of a type which reacts with HF to form an insoluble fluoride thereof to passivate the metal layer. The process includes first contacting the upper layer with a buffered, aqueous etching solution of HF and $NH_4F$ to remove that layer and to passivate the metal layer. Next the passivated layer is contacted with aqueous $NH_4F$ which is free of HF. This step prevents the subsequent deterioration of the passivated layer when the article is subsequently rinsed in water. Deterioration prevention is effected by the action of the $NH_4F$ in inhibiting formation of $HF_2^-$ ions. The article may be an in-process I.C. containing numerous MOS devices and the layers may be $SiO_2$ and Al, respectively.

12 Claims, No Drawings

PREVENTION OF ALUMINUM ETCHING DURING SILOX PHOTOSHAPING

This invention relates to an improved process of treating an article, and more particularly to an improved process of treating a multi-layered article by selectively etching one layer and passivating a thereby exposed layer.

The manufacture of electrical devices, such as integrated circuits (IC's), usually involves one or more selective deposition and/or removal steps to define on a substrate a variety of individual electrical components such as, FET's, MOSFET's, conductors, capacitors, resistors and the like, thus forming a complex multi-layered article.

Typical integrated circuits usually include a doped substrate often of silicon (N or P-type) having selectively diffused regions (P or N) therein. On top of the substrate and the diffused regions is a passivating, insulating or encapsulating layer, often of $SiO_2$ or $Si_3N_4$. Also beneath the insulating layer are metallic interconnections between the diffused regions, as well as MIS (metal-insulator-substrate) capacitors.

One kind of IC is a complex multi-layered article which contains numerous similar MOS devices. Such a circuit may include a phosphorus-doped, N-type silicon substrate having boron-doped diffused P-regions therein. These regions are overlain by an insulative layer (usually of silicon dioxide) and by electrically conductive layers (e.g., aluminum) between the diffused regions. Some of the conductive layers directly contact the diffused regions as sources or drains, and others are separated from the substrate by a thin oxide layer to form gates. Each MOS device includes a source, a drain and a gate.

As already noted, a penultimate processing step for such circuits, IC's in general and MOS IC's in particular, usually includes the covering thereof with a passivation, encapsulation or insulation layer, such as silicon dioxide. This encapsulation layer renders the IC chemically and electrically stable and provides a physical "cover" therefor.

In order to permit connection of the conductive layers to outside circuitry, photoshaping techniques are usually employed to selectively open windows through the encapsulation layer over portions of the conductive layers so that physical and electrical connection may be made thereto. Specifically, a photoresist is spun onto the encapsulation layer, selectively exposed to light or other radiation and then developed to define an etching mask. Subsequently the encapsulation layer is exposed to an etchant therefor. If the encapsulation layer is silicon dioxide, a typical etchant is an aqueous solution of HF and $HN_4F$. The etchant removes the unmasked portions of encapsulation layer until the underlying portions of the conductor layers are exposed.

The conductor layers may be any of a wide variety of metals, typically aluminum, which react with the HF to convert several hundred A thereof into an adherent insoluble fluoride of the metal, aluminum fluoride ($AlF_3$) where the layer is aluminum. The metal fluoride remains on and passivates the conductor layer. Ultimately the etching action and metal conversion cease due to such passivation.

The etching step is followed by a water rinse to remove adherent etchant prior to subsequent processing steps.

It has been found that, for reasons not fully understood, following the above procedures often results in removal, often complete, of the conductor layers, in and following the water rinse. This removal renders the IC unuseable.

Accordingly, one object of this invention is the provision of an improved process for treating articles. Another object of this invention is to provide an improved process of treating a multi-layered article wherein one layer is etched and a layer exposed thereby is then passivated by the etchant.

A further object of this invention is an improved process for selectively removing an HF-etchable layer from a metal layer with an HF-containing etchant wherein damage to the metal layer is effectively prevented.

Another object of this invention is an improved process for treating IC's wherein damage to the conductor layers thereof during selective removal of the encapsulation layer thereover is eliminated.

SUMMARY OF THE INVENTION

With these and other objects in view, the present invention contemplates an improved process for treating multi-layered articles. The article includes an upper layer, which is etchable by HF, on top of a metal layer. The metal is of a type which reacts with HF to form an adherent layer of a highly insoluble fluoride of the metal upon contact with HF, the fluoride layer passivating the metal layer.

The upper layer is first exposed to an HF-containing etchant, preferably an aqueous solution of HF and $HN_4F$, to selectively remove the layer and expose portions of the metal layer which portions are then passivated. Subsequently, the passivated metal lay portions are contacted with an aqueous solution of $NH_4F$ substantially free of HF. This latter step prevents deterioration of the metal layer which has been found to occur during following processing steps, such as rinsing the article in water.

DETAILED DESCRIPTION

Articles treated by the present process may be any type of multi-layered device which includes a top layer of an HF-etchable material and one or more underlying layers of a metal. The metal is of a type which is passivated by reaction with HF, specifically by the formation of an adherent, highly insoluble fluoride of the metal. Although the reaction of the metal with the HF may be viewed as the "removal" of metal, in fact, the highly insoluble metal fluoride desirably remains on the surface of the metal, metal "removal" ceasing after several hundred A have been converted to the fluoride.

In a preferred form of the invention, the articles are IC's having as the top layer an encapsulation layer of $SiO_2$. The underlying layers are a conductive metal, typically aluminum, connected either directly to diffused regions of a silicon substrate or to insulated areas of the substrate. If the IC is a MOSFET, the former serves as drains or sources of the FET and the latter are gates of the FET or MIS capacitors.

The upper layer is first exposed to an HF-containing etchant solution. Such exposure may be selectively effected through the apertures of an etching mask formed by well-known photoresist or photoshaping techniques.

Where the layer is $SiO_2$ the etchant is preferably an aqueous solution of $NH_4F$ and HF. Typically the $NH_4F$ to HF ratio is in the range 5:1 – 20:1, of 40 weight percent $NH_4F$ and 48 – 50 weight percent HF.

The exposed portions of the upper layer are thereby selectively etched by the HF. Where the upper layer is $SiO_2$, the etching action is represented by $$SiO_2 + 4HF \longrightarrow \underset{(gas)}{SiF_4} + 2H_2O$$

Exposure of the upper layer for a sufficient time depending on its thickness results in complete removal thereof where the mask is open and exposure of the metal layer to the etchant through the windows so formed. The HF now reacts with the metal layer through such windows to form a highly insoluble, adherent metal fluoride thereon. After a time, a sufficient thickness and density of the fluoride forms to passivate the metal and terminate the reaction.

Where the metal is aluminum the reaction is $$2Al + 6HF \rightarrow 2AlF_3 + 3H_2.$$

The $NH_4F$, or a similar buffering agent, ensures a stable H ion concentration. Accordingly, during the metal-HF reaction, the $NH_4F$ prevents dissolution of the fluoride, here aluminum fluoride, and ensures that the fluoride remains on the metal to effect passivation.

Specifically, although the metal fluoride is highly insoluble, were it not for the buffering agent, the small, but finite, solubility of this fluoride would permit it to be dissolved. This dissolution would constantly expose metal to the HF, ultimately resulting in conversion of all the metal to a dissolved fluoride. The presence of the buffering agent gives rise to the common ion effect, which, along with the low solubility of the fluoride, results in passivation of the metal layer. That is, the metal layer retains thereon the highly insoluble layer of a fluoride thereof.

More specifically, the formation of $AlF_3$, in effect removes fluoride ion ($F^-$) from the solution. But because of the large amount of $F^-$ ions contributed by the $NH_4F$, the total $F^-$ ion removed from the solution is negligible with respect to the total. More specifically, without the $NH_4F$ in the solution, the following equilibrium condition would obtain:

$$AlF_3 \rightleftarrows Al^{3+} + 3F^-.$$

The $NH_4F$ results in the common ion effect whereby the large amount of common $F^-$ ions therein make the $$Al^{3+} + 3F^- \rightarrow AlF_3$$

reaction more prevalent and larger than $$AlF_3 \rightarrow Al^{3+} + 3F^-.$$

Such prevalence and the high insolubility of $AlF_3$ lead ultimately to the adherent $AlF_3$ layer passivating the aluminum.

According to past procedures the article was next rinsed in water to remove any of the etchant solution adhering to the article. It was noted that the metal layer was deteriorated by this rinse. Specifically, the metal layer was noted to be removed or etched at a rate of 2,000A per minute or more. Thus, depending on its thickness, the metal layer could well be completely etched away. In the case of MOS devices such removal rendered the devices completely unuseable. The cause of this undesirable etching is not completely understood. It is known, however, that neither HF nor $NH_4F$ alone in the concentration (about 0.05 – 1percent) present in the water rinse effect such undesirable etching.

It has been found that contacting the passivated metal layer with a solution containing a large excess of the fluoride ion prevents such deterioration of the metal layer in subsequent rinsing operations. Where the metal layer is aluminum, a preferred solution of $NH_4F$ which, it has also been found, must be substantially free of all HF.

The passivated metal layer may remain in contact with the $NH_4F$ for any desired time, a minimum time of about 5 seconds being desirable but sufficient. After this time the article may be rinsed in water without any detectable deterioration of the passivated metal layer.

POSSIBLE THEORY

A possible explanation of the theory of operation of this invention has been postulated.

Specifically, as noted earlier it is thought that during the etching step both the finite, but very small, solubility of the $AlF_3$, as well as the common ion effect prevent deterioration of the $AlF_3$ layer as it forms via the previously-recited reaction. HF does not occur as such but as $H_2F_2$. Upon ionization in water $HF_2^- + H^+$ results. It is theorized that the $HF_2^-$ species would, if possible, attack the metal layer during the etch/passivation step. However, the large amount of fluoride ion from the $NH_4F$ in the etchant both prevents dissolution of the $AlF_3$ passivating layer and prevents or suppresses the deleterious action of the $HF_2^-$. Thus, when a sufficiently thick, and highly insoluble, passivation layer exists, further reaction of the Al with HF ceases.

In the water rinse, however, the HF and $NH_4F$ adhering to the article and to the passivated metal layer become very dilute. HF is a weak acid, but as its concentration is decreased in water its ionization increases, generating a large amount of the $HF_2^-$ species. Moreover, the now dilute $NH_4F$ is unable to give rise to the common ion effect. This inability coupled with the finite (though small) solubility of the $AlF_3$ and the attack of the Al by the $HF_2^-$ species, deteriorates the Al layer, it is suspected, to the extent that aluminum is continually exposed. Thus, the reactions $$Al^{3+} + 3F^- \rightarrow AlF_3$$
$$AlF_3 \rightarrow Al^{3+} + 3F^-$$

are both free to occur, the formation of the $Al^{3+}$ ion in the second reaction not being suppressed by the common ion effect.

Typically, the concentration of HF and $NH_4F$ in the water rinse is from 0.05 to 1 percent, and is usually about 0.5 percent. It is thought that within this concentration range the deterioration of the Al layer occurs within the water rinse.

It is also thought that the deterioration and removal of the Al removal may be at least partly due to electrochemical attack. Specifically, in the water rinse, an electrochemical cell is formed. The cell includes the metal layer, the doped silicon and the dilute HF and $NH_4F$. The presence of such a cell is felt to accentuate or accelerate the deterioration of the Al layer.

Thus, the theory continues, contacting the passivation layer with $NH_4F$ substantially free of HF suppresses the $HF_2^-$ species. Typically the $NH_4F$ is an aqueous solution of 40 weight percent, although this concentration is not critical.

CONCLUSION

Regardless of the actual cause of the Al removal, contacting the passivated metal layer with HF-free $NH_4F$ prevents any such undesirable effects on the article in a subsequent water rinse.

Although only one specific embodiment of the invention is described in the foregoing specification, it will be understood that the invention is not limited to the specific embodiment described, but is capable of modification and rearrangement and substitution of materials without departing from the spirit of the invention.

What is claimed is:

1. An improved process of the type wherein an article having a first layer, etchable with HF, on a second metal layer is treated by first contacting the first layer with an etchant consisting essentially of an aqueous solution of HF and $NH_4F$, and wherein the etchant after etching away the first layer passivates the second layer by forming a highly insoluble fluoride of the metal thereon, and the article is then rinsed, the improvement comprising:

before the water rinse step, contacting the passivated layer with a substantially HF-free aqueous solution consisting essentially of $NH_4F$ to prevent deterioration of the passivated layer.

2. The process of claim 1 wherein the second layer is aluminum.

3. The process of claim 2 which comprises the additional step of:

selectively masking the first layer prior to the etchant-contacting step with an etchant-resistant material.

4. The process of claim 3 wherein the first layer is $SiO_2$.

5. The process of claim 4 wherein the article is an in-process I.C. and the aluminum layer is in contact with doped silicon.

6. An improved process for treating an article having a first layer removable by hydrofluoric acid on a second metal layer of a type which reacts with hydrofluoric acid to form an insoluble fluoride of the metal which passivates the second layer, the process being of the type wherein the article is:

a. first treated by contacting the first layer with an etchant consisting essentially of an aqueous solution of HF and $NH_4F$, and wherein the etchant after dissolving the first layer also passivates the surface of the second layer by forming a surface layer of a metal fluoride; and b. then rinsed in water, the improvement comprising:

between steps (a) and (b) immersing the article in an aqueous solution consisting essentially of $NH_4F$ and substantially free of HF to prevent deterioration of the passivated layer.

7. An improved process of the type wherein an article having an $SiO_2$ layer on an aluminum layer is treated by contacting the $SiO_2$ layer with an etchant consisting essentially of an aqueous solution of HF and $NH_4F$, and wherein the etchant after dissolving the $SiO_2$ layer also passivates the surface of the aluminum layer by forming a surface layer of $AlF_3$ and the article is thereafter rinsed in water, the improvement comprising:

before the water rinse step immersing the passivated article in an aqueous solution consisting essentially of $NH_4F$ and substantially free of HF, so as to inhibit deterioration and removal of the passivated layer.

8. A process for treating an article having a first, HF-etchable layer on a second metal layer, the metal being of a type which reacts with HF to form an insoluble metal fluoride which passivates the second layer, comprising the steps of:

a. contacting the article with an etchant consisting essentially of HF and $NH_4F$ to remove the first layer and to expose and passivate the second layer; and then b. contacting the passivated second layer with a substantially HF-free aqueous solution consisting essentially of $NH_4F$.

9. The process of claim 8 which further comprises the initial step of:

masking the first layer to effect selective removal of the first layer by the etchant and selective passivation of the portions of the second layer exposed by such removal.

10. The process of claim 9 wherein the metal is aluminum.

11. The process of claim 9 wherein the first layer is $SiO_2$.

12. The process of claim 9 wherein:

the first layer is $SiO_2$; and the second layer is aluminum.

* * * * *